(12) United States Patent
Mosinskis et al.

(10) Patent No.: US 8,200,179 B1
(45) Date of Patent: Jun. 12, 2012

(54) COMBINED VARIABLE GAIN AMPLIFIER AND ANALOG EQUALIZER CIRCUIT

(75) Inventors: Paulius Mosinskis, Richalandtown, PA (US); Richard Booth, Riegelsville, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 302 days.

(21) Appl. No.: 12/637,884

(22) Filed: Dec. 15, 2009

Related U.S. Application Data

(63) Continuation-in-part of application No. 12/246,737, filed on Oct. 7, 2008.

(51) Int. Cl.
H04B 1/06 (2006.01)
H04B 7/00 (2006.01)
H04B 1/28 (2006.01)

(52) U.S. Cl. ............... 455/232.1; 455/240.1; 455/252.1; 455/333; 375/233

(58) Field of Classification Search .................. 455/136, 455/138, 232.1, 234.1–234.2, 239.1–240.1, 455/249.1–252.1, 333; 375/229, 230, 232–233
See application file for complete search history.

(56) References Cited

U.S. PATENT DOCUMENTS

| | | | |
|---|---|---|---|
| 6,937,054 B2 | 8/2005 | Hsu et al. | |
| 7,009,425 B1 * | 3/2006 | Loinaz et al. | 326/83 |
| 7,034,606 B2 * | 4/2006 | Caresosa et al. | 327/563 |
| 7,126,987 B2 | 10/2006 | Shi et al. | 375/229 |
| 7,164,711 B2 | 1/2007 | Yang et al. | 375/229 |
| 7,236,011 B2 | 6/2007 | Tam | |
| 7,288,971 B1 * | 10/2007 | Plasterer et al. | 326/127 |
| 7,389,091 B2 | 6/2008 | Tanaka | |
| 7,521,976 B1 | 4/2009 | Sudjian et al. | |
| 7,560,957 B2 * | 7/2009 | Chen et al. | 326/115 |
| 7,592,869 B2 * | 9/2009 | Bae et al. | 330/254 |
| 7,619,448 B2 * | 11/2009 | Wu et al. | 327/108 |
| 7,664,170 B2 * | 2/2010 | Tonietto et al. | 375/229 |
| 7,919,985 B2 | 4/2011 | Green | |
| 7,928,765 B2 | 4/2011 | Hoque et al. | |
| 2003/0095005 A1 | 5/2003 | Morie et al. | 330/254 |
| 2004/0227573 A1 | 11/2004 | Soda | |
| 2005/0017784 A1 * | 1/2005 | Takenaka | 327/359 |
| 2006/0088089 A1 | 4/2006 | Gondi et al. | 375/232 |
| 2007/0098412 A1 | 5/2007 | Scoggins et al. | 398/182 |
| 2007/0115048 A1 | 5/2007 | Mansuri et al. | |

(Continued)

OTHER PUBLICATIONS

Sunderarajan S. Mohan et al., "Bandwidth Extension in CMOS with Optimized On-Chip Inductors," IEEE Journal of Solid-State Circuits, vol. 35, No. 3, Mar. 2000, pp. 346-355.

(Continued)

Primary Examiner — Simon Nguyen
(74) Attorney, Agent, or Firm — Mendelsohn, Drucker, & Associates, P.C.

(57) ABSTRACT

In one embodiment, a combined VGA-and-equalizer (VGA-EQ) circuit for a communication link includes a current-mode logic ("CML") amplifier with an inductive load circuit. The CML amplifier has a gain control terminal and is operable to amplify, with an adjustable gain, a signal received at an input terminal and provide the amplified signal at an output terminal. The CML amplifier has a first gain at frequencies below a predetermined frequency value and a second gain at frequencies in a predetermined frequency range above the predetermined frequency value, wherein the second gain is higher than the first gain. The higher second gain of the VGA-EQ circuit causes a reduction in inter-symbol interference in a signal received by the receiver.

17 Claims, 8 Drawing Sheets

U.S. PATENT DOCUMENTS

2007/0159247 A1    7/2007  Lee et al.
2008/0055005 A1*   3/2008  Nam et al. ............... 330/277
2008/0106336 A1*   5/2008  Pera ....................... 330/260
2008/0231369 A1*   9/2008  Kim et al. ............... 330/278

OTHER PUBLICATIONS

John Choma, Jr. et al., "*A Broad-Banded Integrated Common-Collector Common-Base Differential Quartet*," IEEE Journal of Solid-State Circuits, vol. SC-16, No. 2, Apr. 1981, pp. 86-93.

C.T. Chiu et al., "*A 3.2Gb/s 20:1 CML Transmitter in 0.18 μm CMOS Technology*," VLSI Design/CAD, 2005, Hau-Lien, Taiwan, Aug. 2005. 4 pages.

Thomas H. Lee, "*The Design of CMOS Radio-Frequency Integrated Circuits*," The Press Syndicate of the University of Cambridge, First Published 1998, pp. 178-185.

Keng Leong Fong et al., "*Monolithic RF Active Mixer Design*," IEEE Transactions on Circuits and Systems-II: Analog and Digital Processing, vol. 46, No. 3, Mar. 1999, pp. 231-239.

Srikanth Gondi et al., *Equalization and Clock and Data Recovery Techniques for 10-Gb/s CMOS Serial-Link Receivers*, IEEE Journal of Solid State Circuits, vol. 42, No. 9, Sep. 2007, pp. 1999-2011.

Jongrit Lerdworatawee et al., *Wideband CMOS Low Noise Amplifier Design Based on Source Degeneration Topology*, IEEE Trans. On Circuits and Systems I—Regular Papers, vol. 52, Nov. 2005, pp. 2327-2334.

Paul R. Gray et al., *Analysis and Design of Analog Integrated Circuits*, 3$^{rd}$ Edition, Copyright 1993 by John Wiley & Sons Inc., pp. 215-219.

* cited by examiner

700

800

COMBINED VARIABLE GAIN AMPLIFIER AND ANALOG EQUALIZER CIRCUIT

CROSS-REFERENCE TO RELATED APPLICATIONS

This application is a continuation-in-part of co-pending U.S. application Ser. No. 12/246,737, filed Oct. 7, 2008, which is incorporated herein by reference in its entirety.

TECHNICAL FIELD

The present invention relates generally to data communication systems and, more specifically, to channel equalization and variable-gain amplification in a serial communication link.

BACKGROUND

In modern data communication systems, when electrical signals are sent across a lossy channel as a stream of bits, signal dispersion causes adjacent bits to interfere with each other in a process called inter-symbol interference. This interference degrades the received signal and reduces the ability of a receiver to recover the bits that were transmitted. Signal dispersion can be compensated through a process known as channel equalization. In this process, a filter whose characteristics partially or completely cancel the effects of the channel is applied within the receiver, in series with the lossy channel. This filter is known as an "equalizer," and, when implemented in the analog domain, as an "analog equalizer." Further, because it is implemented at the receiver, it is known as a "receive-side equalizer."

Because a given channel characteristic depends on the channel's dielectric type, media, temperature, and length, a highly desirable feature of an analog equalizer is to be able to tune its characteristics. Additionally, once an equalizer characteristic is chosen, it is important for the equalizer to maintain this characteristic independent of semiconductor process variations. Existing implementations of high-speed analog equalizers rely primarily on capacitive-source degeneration of a differential pair. Tuning of such equalizers is usually achieved by using a varactor as the capacitor and adjusting the voltage across the varactor. Alternatively, fixed capacitors may be used in the differential-pair circuit, with a network of switches to switch the fixed capacitors. Yet another variation involves the use of a fixed capacitor with a variable source-degeneration resistor.

A problem that arises in equalizers based on capacitive-source degeneration, however, is that the electrical characteristics of this type of equalizer may vary significantly, based on the process-dependent variations of the passive components (e.g., the source-degeneration resistor and the varactor or capacitor). Because these variations can be ±10% for the capacitor and ±20% for the resistor in modern semiconductor processes, undesirable large variations of the filter characteristics with process may result.

Another problem is that existing equalizers either (i) altogether lack any capability for gain variation or (ii) include a variable-gain amplifier (VGA) that interferes with the equalization. Variable-gain amplification is helpful to insure that the output of the equalizer remains linear over a range of input amplitudes. Conventional combined VGA/equalizer stages, however, suffer from dependent control of gain and the zero position of the equalizer. Stated differently, when the VGA function adjusts the gain, it also adjusts the zero position associated with the equalizer, and vice versa. As such, the gain control and the equalizer control are linked. Tuning of the zero position associated with the equalizer is therefore difficult, and its accurate placement over process variations is nearly impossible. For this reason, implementations that require independent control of both the gain and the zero position of the equalizer usually use a cascade of two separate stages (a VGA followed by an equalizer, or vice versa), which results in significantly higher power dissipation and overall circuit complexity.

SUMMARY

In one embodiment, the present invention is a receiver for a communication link, the receiver comprising a combined variable-gain amplifier and analog equalizer circuit, which comprises a current-mode logic ("CML") amplifier and an inductive load circuit. The CML amplifier has an input terminal, an output terminal, and a gain-control terminal and is operable to amplify, with an adjustable gain, a signal received at the input terminal and provide the amplified signal at the output terminal. The inductive load circuit is coupled to the output terminal of the CML amplifier and has an inductance such that the CML amplifier has a first gain at frequencies below a predetermined frequency value and a second gain at frequencies in a predetermined frequency range above the predetermined frequency value, where the second gain is higher than the first gain.

In another embodiment, the present invention is a method of equalizing a signal having inter-symbol interference. The signal is received and amplified via a CML amplifier with an inductive load and an adjustable gain. The CML amplifier has a first gain at frequencies below a predetermined frequency and a second gain at frequencies in a predetermined frequency range above the predetermined frequency, wherein the second gain is higher than the first gain, such that the inter-symbol interference in the signal is reduced. The amplified signal is outputted.

In yet another embodiment, the present invention is an amplifier circuit comprising (i) a first active inductor including a first transistor, (ii) a second transistor, and (iii) a third transistor. The first transistor has a gate, a drain, and a source, wherein the drain is connected to a supply voltage and the gate is adapted to receive an inductance-adjustment signal. The second transistor has a gate, a drain, and a source, wherein the drain is connected to the source of the first transistor. The third transistor has a gate, a drain, and a source, wherein one of the drain or source of the third transistor is connected to the source of the second transistor and the gate of the third transistor is adapted to receive a gain-control signal, such that the third transistor is adapted to adjust the gain of the amplifier circuit based on the gain-control signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
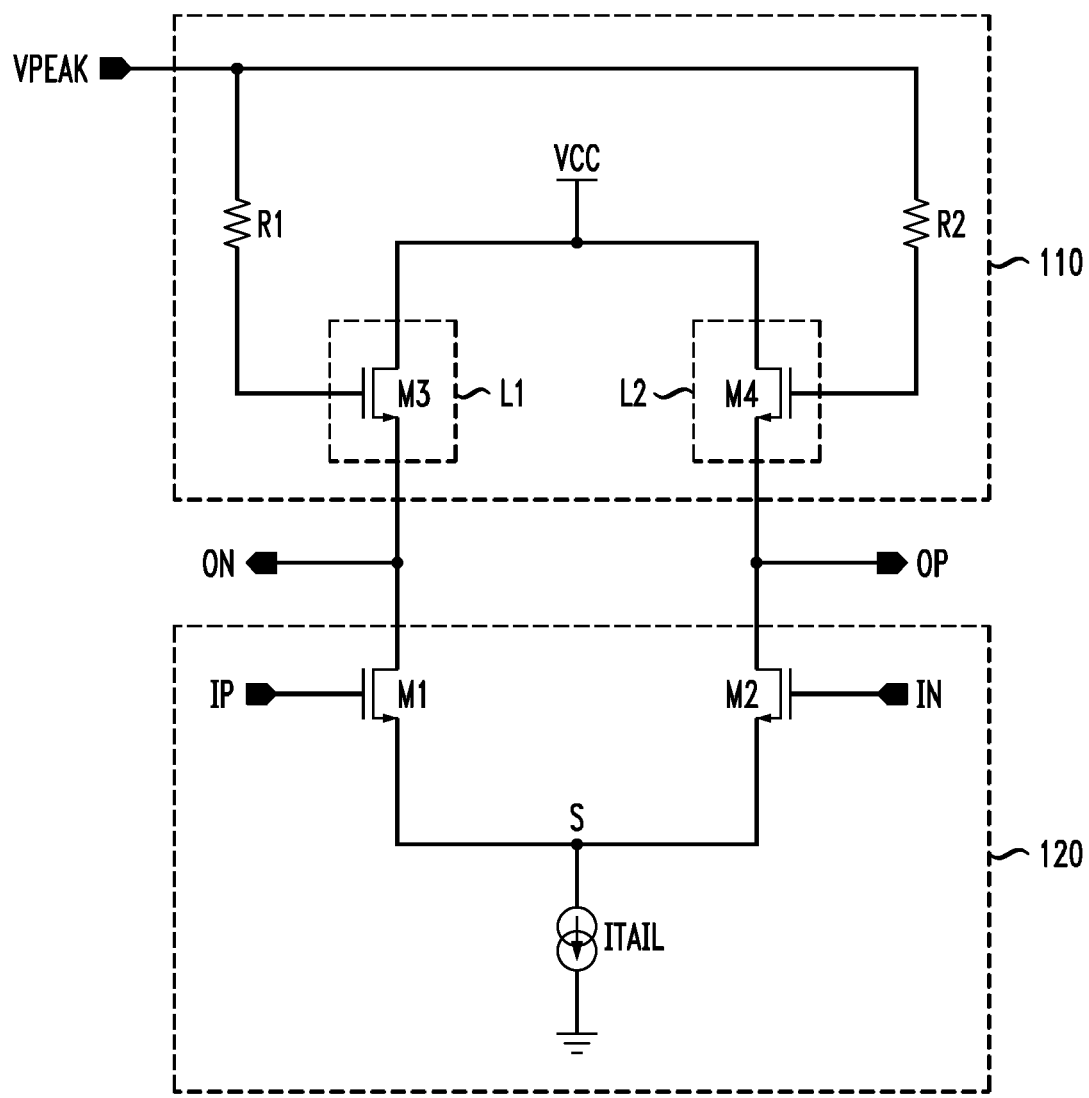
FIG. 1 is a circuit diagram of an analog equalizer.

FIG. 1 depicts an analog equalizer 100. As shown in FIG. 1, analog equalizer 100 includes an amplifier circuit 120 and an inductive load circuit 110. Analog equalizer 100 uses inductive peaking provided by inductive load circuit 110 to create a peak in the response of amplifier circuit 120. Both passive inductors and active inductors (e.g., source-follower amplifiers with resistively tied gates) have been used for many years as loads for current-mode logic (CML) devices, in order to extend their bandwidths. The use of active inductive loads for bandwidth extension has become known as "active peaking." Notwithstanding this nomenclature, however, the goal in designing such loads conventionally has been to provide a maximally flat bandwidth and not to induce any actual peaking in the AC response of the amplifier with which the load is used. In contrast with prior approaches and as explained below, analog equalizer 100 induces a peak in the response of a CML amplifier, such that the amplifier with its inductive load provides an improved analog equalizer.

Amplifier circuit 120 is preferably a CML amplifier comprising n-type amplifying transistors M1, M2, whose source terminals are connected together at node S to current source ITAIL. Current source ITAIL, in turn, is connected to ground. Inductive load circuit 110 includes two inductive elements L1, L2, each connected between a supply voltage VCC and the drain terminal of a respective one of the amplifying transistors M1 and M2. The input to analog equalizer 100 is a differential signal received at input terminals IP and IN, which are connected to the gate terminals of amplifying transistors M1 and M2, respectively. The output from the analog equalizer 100 is taken from output terminals ON and OP.

Inductive elements L1 and L2 may be passive inductors or active inductors. FIG. 1 depicts an analog equalizer in which inductive element L1 is an active inductor formed by an n-type MOSFET transistor M3. The drain terminal of transistor M3 is connected to supply voltage VCC, and the source terminal is connected to the drain terminal of amplifying transistor M1. The gate terminal of transistor M3 is connected through resistor R1 to a peaking-control voltage VPEAK (or, alternatively, to supply voltage VCC). In this configuration, transistor M3 acts as an inductor between supply voltage VCC and the drain terminal of amplifying transistor M1, and its inductance is determined by its geometry and the size of resistor R1. Inductive element L2 is similarly formed by n-type transistor M4 and resistor R2.

Current source ITAIL is preferably implemented as a constant-current current source. The constant-current current source may be referenced to a bandgap voltage or other non-bandgap-based reference, including, e.g., an off-chip precision reference. The constant-current current source may alternatively use the transconductance of a transistor to provide a transconductance-based constant current. Current source ITAIL alternatively may be implemented as a resistor.

In operation, analog equalizer 100 receives a transmission signal to be equalized at input terminals IN and IP. Because the received signal is a binary differential signal, the signal at one input terminal (e.g., terminal IP) will have a high voltage level corresponding to a binary "1" value, while the signal at the other input terminal (e.g., terminal IN) will have a low voltage level corresponding to a binary "0" value. As such, the transistor receiving the binary "1" value at its gate (e.g., transistor M1) will become conductive between its drain and its source, while the transistor receiving the binary "0" value at its gate (e.g., transistor M2) will become nonconductive between its drain and source. Thus, a current having a value substantially determined by current source ITAIL will tend to flow from supply voltage VCC through the conductive transistor (here, transistor M1), as well as through the corresponding inductive element (here, inductive element L1), while little or no current will flow through the nonconductive transistor (here, transistor M2). As a result, output terminal ON will take on a low voltage level corresponding to a binary "0" value, while output terminal OP will take on a high voltage level corresponding to a binary "1" value.

In practice, the actual voltage level of the signal that is output from analog equalizer 100 at output terminals ON and OP is dependent on the frequency of the input signal and on the value of the inductive elements L1 and L2. In one implementation of analog equalizer 100, the inductance values of inductive elements L1 and L2 are selected such that the amplifier circuit 120 has a first gain Av (e.g., zero decibels) at frequencies below a predetermined frequency (e.g., about 100 MHz), and a second gain at a frequency range above the predetermined frequency (e.g., about 100 MHz to about 10 GHz). The first gain, also known as the "low-frequency gain," is given by Equation (1) as follows:

$$Av = gm_{m1} * Ro \approx gm_{m1}/gm_{m3},\quad (1)$$

where $gm_{m1}$ is the transconductance of amplifying transistor M1, Ro is the combined output resistance of (i) transistors M1 and M3 and (ii) the feedback circuit formed by transistor M3, and $gm_{m3}$ is the transconductance of transistor M3. (The approximation in Equation (1) assumes that the output resistances of M1 and M3 are $>>1/gm_{m3}$.) Because both transistors M1 and M3 are NMOS devices, the first gain can be held at a near-constant value over process, voltage, and temperature variations.

The second gain may take the form of an inverted parabola in log-log scale having a peak at a frequency within the range from about 100 MHz to about 4 GHz, more preferably within the range from about 800 MHz to about 2 GHz, and still more preferably within the range from about 1.0 GHz to 1.2 GHz. The amount of intentional peaking will depend on the electrical characteristics of the communication channel to be equalized. In one implementation, the amount of intentional peaking is preferably between 3 decibels and 40 decibels, more preferably between 4 and 10 decibels, and still more preferably between 5 decibels and 7 decibels. It may be noted that the intentional peaking is independent of the terms in Equation (1) above.

Figure 2:
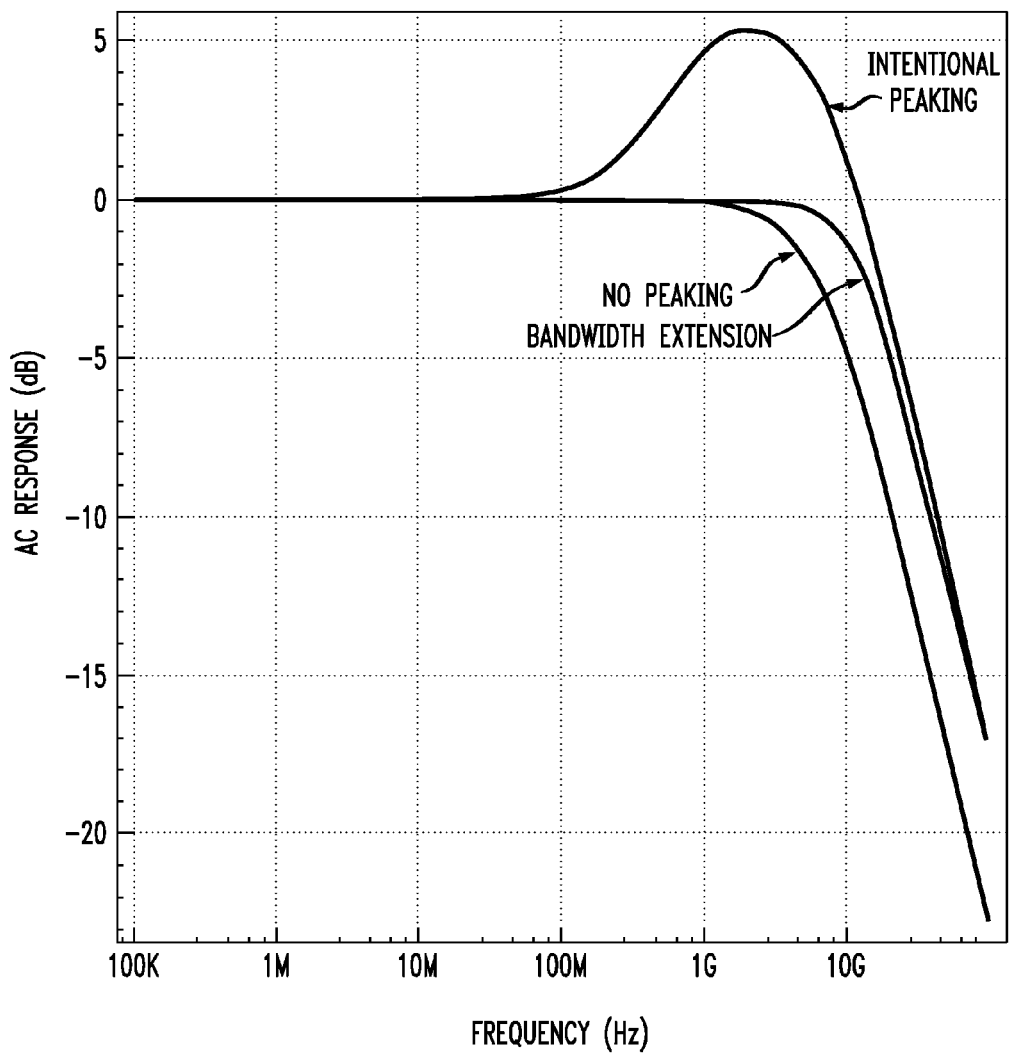
FIG. 2 is a graph illustrating an exemplary frequency response of the analog equalizer shown in FIG. 1.

FIG. 2 depicts frequency-response curves for an intentionally peaked amplifier circuit having inductive peaking in accordance with analog equalizer 100 of FIG. 1, as well as for amplifier circuits having no inductive peaking and active peaking for bandwidth extension. In FIG. 2, the frequency response of the intentionally peaked amplifier circuit 120 is approximately 0 decibels between frequencies 0-100 MHz and rises to a peak value of about 5 decibels at about 1.1 GHz. The frequency response thereafter ramps down to zero decibels at about 10.5 GHz and thereafter falls off sharply with higher frequencies.

It has been determined that the frequency response of the intentionally peaked amplifier circuit 120 having about 6 decibels of inductive peaking is well-matched to the equalizer characteristics needed for channel equalization of a 40" copper trace on FR-4 ("Flame Retardant 4") printed circuit board material. In particular, amplifier circuit 120 provides a 0-decibel gain at frequencies below 100 MHz, and provides amplification at frequencies between 100 MHz and 10.5 GHz. The amplification of higher-frequency components of the received signal serves to reduce the effects of inter-symbol interference. As such, analog equalizer 100 is especially suitable for use in a communication link over FR-4 media. It should be understood, however, that analog equalizer 100 may also be used for equalizing signals carried on traces on other media or on other types of communication structures (e.g., cables), and that the peaking frequency and gain will vary based on the media to be equalized.

Control voltage VPEAK is preferably selected to maximize the output swing of the voltage level at output terminals OP and ON. Control voltage VPEAK's maximum value is limited by the lesser of (i) the gate-oxide breakdown characteristics of transistors M3 and M4 and (ii) the combination of supply voltage VCC, the threshold voltage of transistors M3 and M4, and the overdrive voltage of transistors M3 and M4. Control voltage VPEAK's lower limit is limited by the maximum swing desired at output terminals OP and ON.

In certain complementary metal-oxide semiconductor ("CMOS") integrated circuit ("IC") manufacturing processes, the actual resistance of a resistor as manufactured may vary from a desired design resistance by as much as 20-30%, due to process, voltage, and temperature variations. The variation in the resistance of resistors R1 and R2 may cause undesirable fluctuation in the inductive effect presented by transistors M3 and M4, and thus also in the frequency-response characteristics of analog equalizer 100. This variation in resistance may be greatly reduced, however, if a highly stable voltage-controlled resistive element is substituted for each of the gate-connected resistors R1 and R2. Such a circuit is shown in FIG. 3.

Figure 3:
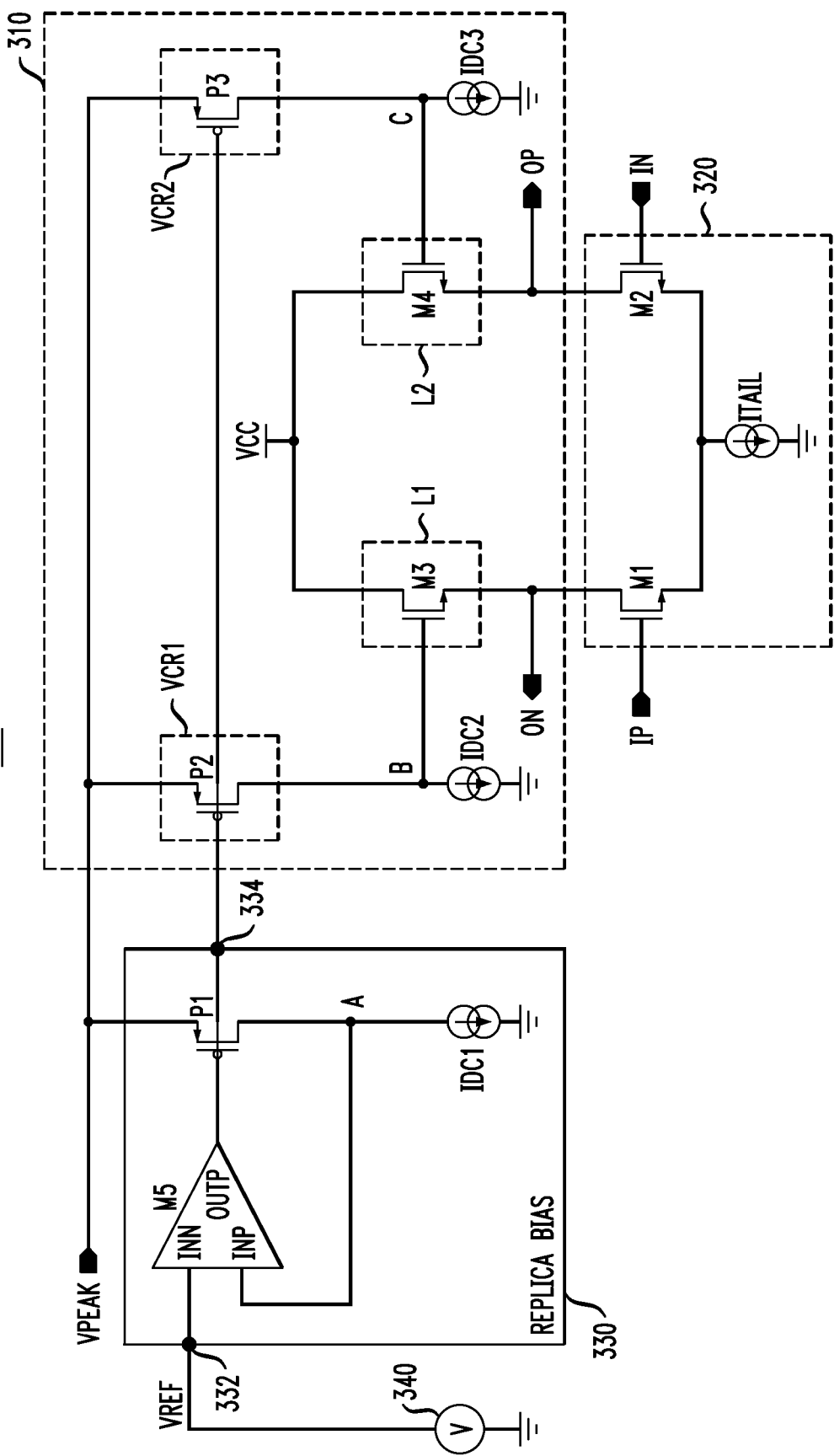
FIG. 3 is a circuit diagram of another analog equalizer.

FIG. 3 depicts a highly stable analog equalizer 300. Analog equalizer 300 includes an amplifier circuit 320 and inductive load circuit 310. In analog equalizer 300, a voltage-controlled resistive element VCR1 is provided between node B, at the gate terminal of transistor M3, and peaking-control voltage VPEAK (or, alternatively, supply voltage VCC), and a voltage-controlled resistive element VCR2 is provided between node C, at the gate terminal of transistor M4, and peaking-control voltage VPEAK (or, alternatively, supply voltage VCC). Voltage-controlled resistive elements VCR1, VCR2 may be implemented, e.g., as p-type metal-oxide semiconductor field-effect transistors ("MOSFETs") P2, P3, as shown in FIG. 3. Transistors P2 and P3 are preferably biased to operate in the linear part of their "triode region"—the region in which the drain-source current $I_{DS}$ varies almost proportionally to the drain-source voltage $V_{DS}$. Further, the drain-source currents of transistors P2 and P3 are determined by current sources IDC2 and IDC3, connected respectively between node B and ground and between node C and ground. Current sources IDC2 and IDC3 are preferably implemented as constant-current current sources referenced to a bandgap voltage or other non-bandgap-based reference, including, e.g., an off-chip precision reference. Current sources IDC2 and IDC3 alternatively may be implemented as resistors.

The gate bias voltage for transistors P2 and P3 may be provided by a replica bias circuit 330. Replica bias circuit 330 includes a differential amplifier M5, a p-type transistor P1, and a current source IDC1. Current source IDC1 is preferably implemented as a constant-current current source referenced to a bandgap voltage but alternatively may be implemented as a resistor. The drain of transistor P1 is connected to peaking-control voltage VPEAK (or, alternatively, to supply voltage VCC). The current source IDC1 is connected between node A at the source of transistor P1 and ground. As such, the drain-source current through transistor P1 is substantially determined by the current source IDC1. Differential amplifier M5 is preferably an operational amplifier having a non-inverting input terminal INP, an inverting input terminal INN, and an output terminal OUTP. Inverting input terminal INN receives a reference voltage VREF, which is preferably derived from a highly accurate on-chip bandgap voltage supply. The non-inverting input terminal INP is connected to node A, and the output terminal OUTP is connected to the gate terminal of transistor P1.

In this configuration, transistor P1 is located within a feedback loop running from output terminal OUTP at the differential amplifier M5 through transistor P1, node A, and the non-inverting input terminal INP at the differential amplifier M5. The feedback through the feedback loop causes the voltage at node A to be equal to the reference voltage VREF. As such, assuming that errors in the feedback loop are small, then the drain-source resistance of the transistor P1 will be regulated to within the combined accuracy of the bandgap voltage supply (e.g., as low as approximately ±0.5% error, if the bandgap voltage is trimmed) and current source IDC1.

The gate terminals of transistors P2 and P3 are also connected to the output terminal OUTP of differential amplifier M5 and to the gate terminal of transistor P1. Transistors P2 and P3 thus form an open-drain current mirror with transistor P1. As such, assuming that transistors P2 and P3 match transistor P1, and current sources IDC2 and IDC3 match current source IDC1, the drain-source resistances of transistors P2 and P3 will then also match the drain-source resistance of transistor P1. Because the resistance of transistor P1 (and, therefore, of transistors P2 and P3) is based principally on the accuracy of current source IDC1 and reference voltage VREF, the frequency of the frequency-response peak of amplifier 120 is greatly decoupled from semiconductor process and temperature variations.

Reference voltage VREF is preferably an adjustable voltage provided by an adjustable voltage supply 340. In one embodiment, adjustable voltage supply 340 is a voltage-selection circuit configured to select one of a plurality of different fractions of the voltage supplied by an on-chip bandgap voltage supply. The voltage-selection circuit may be implemented, e.g., via a conventional current-based digital-to-analog converter or a conventional resistive ladder with switched voltage taps. By adjusting the reference voltage VREF, the resistances of transistors P1, P2, and P3 may be adjusted over a relatively large range, especially because the resistance of a trioded transistor has a relatively large change with respect to its gate voltage. Consequently, the effective inductance of transistors M3 and M4 and, accordingly, the filter characteristics of amplifier 120 may be adjusted over a relatively large tuning range. In essence, as reference voltage VREF is increased, the width of the peaking provided by the circuit decreases, and the center frequency of the peaking increases. This result is similar to decreasing the size of a passive inductor.

Tunable analog equalizer 300 has significant advantages over conventional equalizers based on capacitive degeneration. Because no varactors, capacitors, and tuning resistors are employed, the variation with process of tunable analog equalizer 300 can be reduced to the variation of (i) an on-chip bandgap (about 0.5% if the bandgap is trimmed) and (ii) the gate-oxide thickness of transistors M3 and M4. Further, the elimination of varactors and capacitors results in a large savings in integrated circuit die area. Finally, whereas conventional equalizers can only achieve roughly a 4:1 range in tuning while maintaining a constant gain, tunable analog equalizer 300 is able to achieve at least about a 5:1 tuning range and as great as about a 10:1 tuning range, or even larger.

Figure 4:
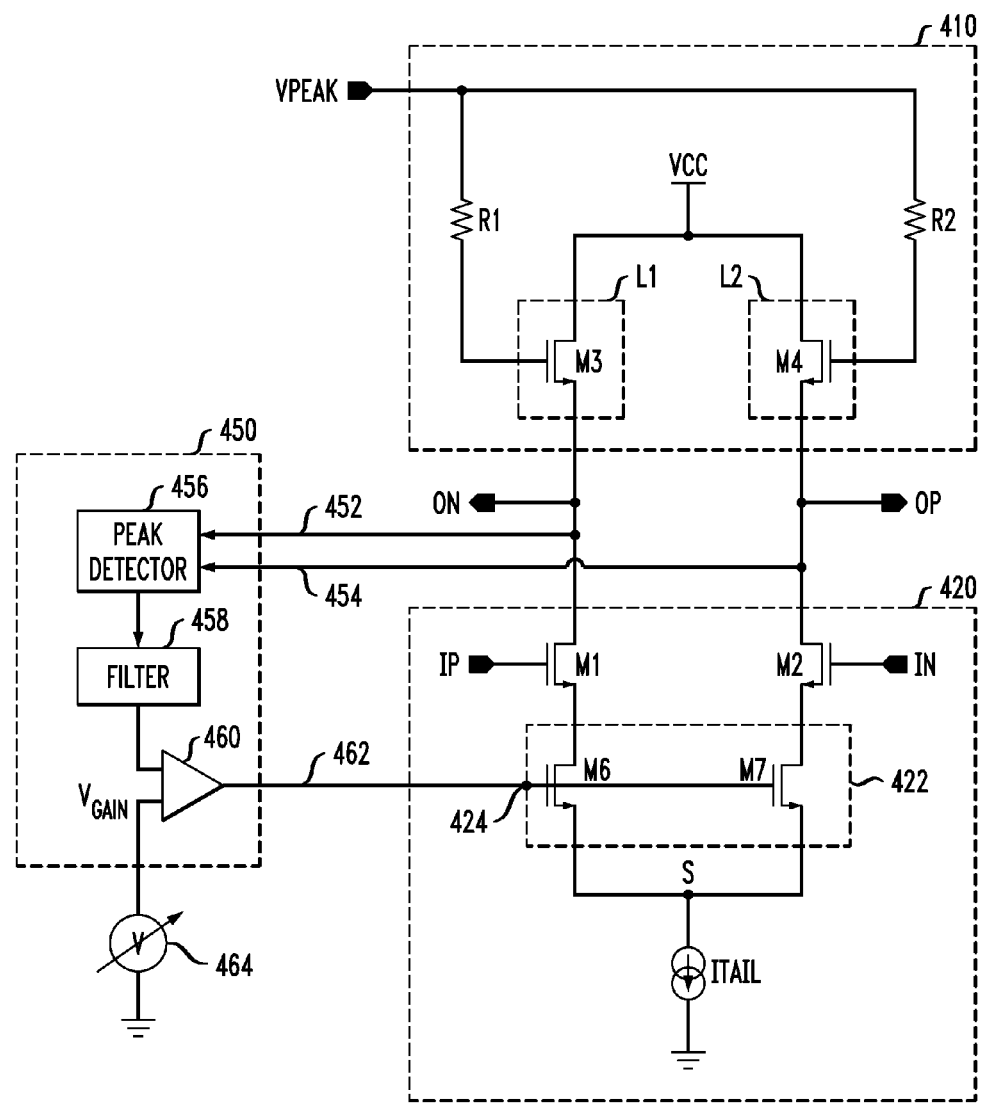
FIG. 4 is a circuit diagram of a combined variable-gain amplifier and analog equalizer circuit in accordance with one embodiment of the invention.

FIG. 4 depicts a combined VGA-and-equalizer (VGA-EQ) circuit 400 in accordance with one embodiment of the invention. VGA-EQ circuit 400 is similar to, and operates similarly to, analog equalizer 100 (described above with reference to FIG. 1) and shares in the above-described advantages. VGA-EQ circuit 400, however, additionally comprises an adjustable source-degeneration device 422 and a gain controller 450.

Source degeneration device 422 is connected (i) between node S and the source of amplifying transistor M1 and (ii) between node S and the source of amplifying transistor M2. Source-degeneration device 422 has a control terminal 424 to receive a gain-control signal and is adapted to adjust the low-speed gain of combined VGA-EQ circuit 400 based on the gain-control signal. In particular, source-degeneration device 422 comprises (i) a gain-adjustment transistor M6 connected between node S and the source of amplifying transistor M1 and (ii) a matching gain-adjustment transistor M7 connected between node S and the source of amplifying transistor M2. Gain-adjustment transistors M6 and M7 are preferably biased to operate in their triode regions.

Gain controller 450 is connected to output terminals ON and OP via connections 452 and 454, respectively, and to control terminal 424 of source-degeneration device 422 via connection 462. Gain controller 450 is adapted to receive the output signals ON and OP and a gain-control setpoint voltage $V_{GAIN}$ and to provide the gain-control signal to source-degeneration device 422 based on the output signals ON and OP and the gain-control setpoint voltage $V_{GAIN}$. In an alternative embodiment, gain controller 450 may be connected to one or the other of output terminals ON and OP and may be adapted to provide the gain-control signal to source-degeneration device 422 based on only that one or the other of output signals ON and OP and the gain-control setpoint voltage $V_{GAIN}$.

Gain controller 450 operates to limit the peak-to-peak voltage of output signal ON and/or output signal OP and thus to reduce distortion caused by VGA-EQ circuit 400. Gain controller 450 may be implemented via either analog or digital components. In one embodiment, gain controller 450 comprises peak detector 456 adapted to determine the peak-to-peak voltage of output signal ON (and/or OP) connected to a filter 458 adapted to filter the output of the peak detector. The output of filter 458 is input to a first input of operational amplifier 460 (or, alternatively, a difference amplifier) and a gain-control setpoint voltage $V_{GAIN}$ is input to a second input of operational amplifier 460. Based on these two inputs, operational amplifier 460 provides the gain-control signal to source-degeneration device 422 via connection 462. Filter 458 may be a low-pass or bandpass filter.

Gain-control setpoint voltage $V_{GAIN}$ is preferably an adjustable voltage provided by an adjustable voltage supply 464. In one embodiment, adjustable voltage supply 464 is a voltage-selection circuit configured to select one of a plurality of different fractions of the voltage supplied by an on-chip bandgap voltage supply. The voltage-selection circuit may be implemented, e.g., via a conventional current-based digital-to-analog converter or a conventional resistive ladder with switched voltage taps.

The low-frequency-gain transfer function for VGA-EQ circuit 400 is given by Equation (2) as follows:

$$Av=(gm_{m1}/(gm_{m1}*Rs))*Ro=Ro/Rs=1/(gm_{m3}*Rs) \quad (2)$$

assuming that $gm_{m1}*Rs>>1$ and $gmb_{m1}=0$, where $gm_{m1}$ is the transconductance of amplifying transistor M1, Ro is the output resistance of VGA-EQ circuit 400, Rs is the source-drain resistance of gain-adjustment transistor M6, and $gm_{m3}$ is the transconductance of transistor M3. Because transistors M1, M3, M6, and M7 are NMOS devices of the same type, the low-frequency gain of VGA-EQ circuit 400 can be held at a near-constant value over process, voltage, and temperature variations but nevertheless may be adjusted by adjusting the gain-control signal. Transistors M6 and M7 thus provide low-frequency gain control for VGA-EQ circuit 400.

Advantageously, the gain control is substantially independent of the equalizer peaking (or filtering) performance of VGA-EQ circuit 400, because Equation (2) does not contain any terms that alter or interact with the implementation of peaking in VGA-EQ circuit 400. As such, adjusting the gain-control signal at the gates of gain-adjustment transistors M6 and M7 does not significantly impact the peaking performance of VGA-EQ circuit 400. Conversely, adjusting the filter characteristics (by adjusting the inductance of inductances L1 and L2) does not significantly alter the gain of VGA-EQ circuit 400. Moreover, the peaking performance of VGA-EQ circuit 400 is also substantially independent of the size of transistors M6 and M7, assuming that any poles or zeros formed in the circuit by transistors M6 and M7 are of a smaller order of magnitude than the zero formed by inductive elements L1 and L2.

Figure 5:
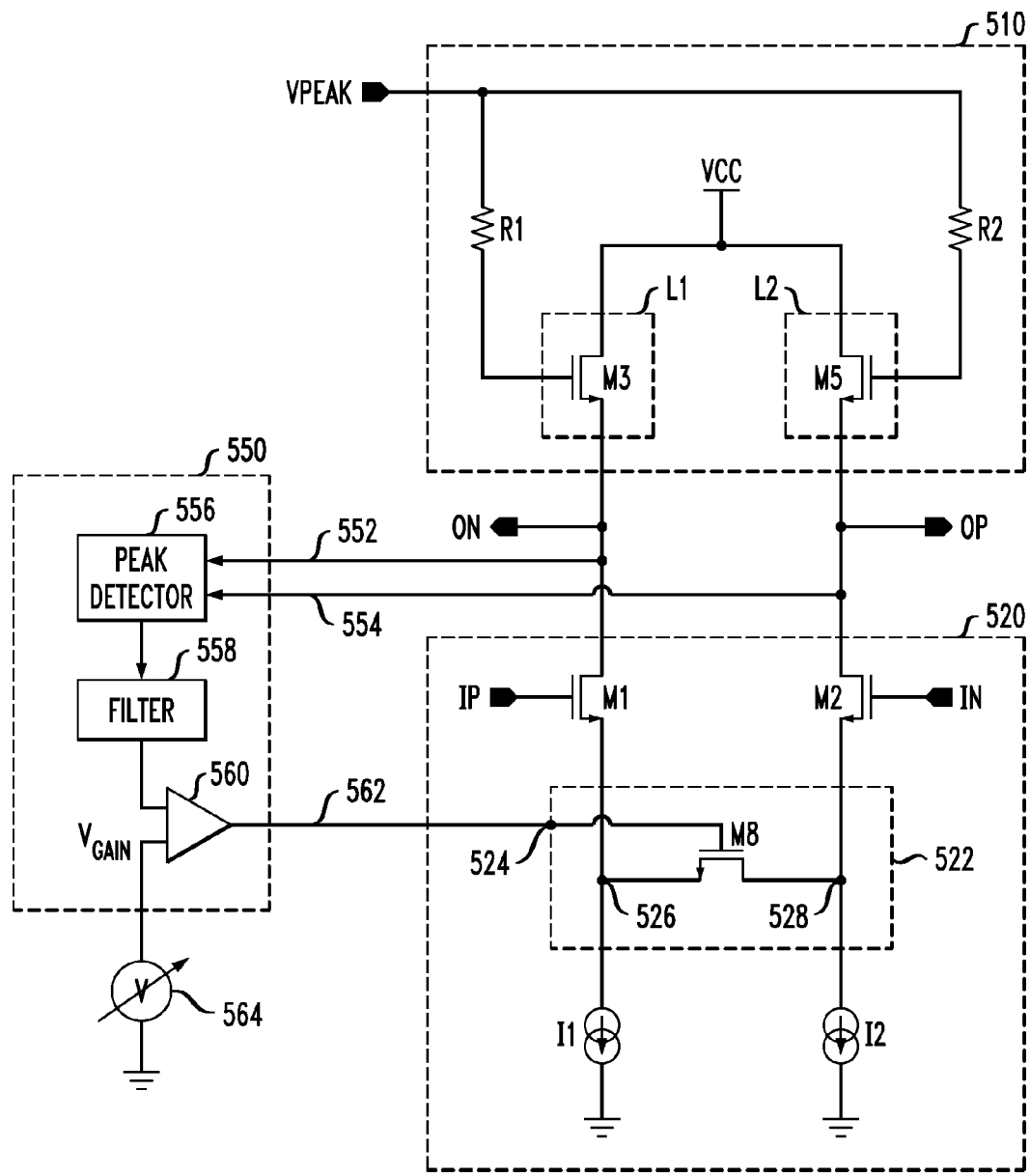
FIG. 5 is a circuit diagram of a combined variable-gain amplifier and analog equalizer circuit in accordance with another embodiment of the invention.

FIG. 5 depicts a combined VGA-and-equalizer (VGA-EQ) circuit 500 having an alternative differential-pair architecture in accordance with another embodiment of the invention. VGA-EQ circuit 500 is similar to, and operates similarly to, VGA-EQ circuit 400, with the exception that (i) VGA-EQ circuit 500 comprises two tail-current sources I1 and I2 and (ii) source degeneration device 520 comprises a single gain-adjustment transistor M8. (In FIGS. 4 and 5, similar reference numerals identify similar elements.) Each of tail-current sources I1 and I2 in FIG. 5 provides about one-half of the current provided by current source ITAIL in FIG. 4. Tail-current sources I1 and I2 are preferably implemented as constant-current current sources referenced to a bandgap voltage or other non-bandgap-based reference (including, e.g., an off-chip precision reference) but may alternatively be implemented as a resistor. Gain-adjustment transistor M8 is preferably biased to its triode region and thus acts as an adjustable resistor that provides resistive source degeneration between nodes 526 and 528.

By way of explanation, assume that (i) terminal IP receives a signal having a high-voltage level corresponding to a binary "1" value and (ii) terminal IN receives a signal having a low-voltage level corresponding to a binary "0" value. As such, the transistor receiving the binary "1" value at its gate (e.g., transistor M1) tends to become more conductive between its drain and its source, while the transistor receiving the binary "0" value at its gate (e.g., transistor M2) tends to become less conductive between its drain and source. The current through transistor M1 will thus be greater than the current through transistor M2 and will be equal to a portion of current I1 plus a portion of current I2. Because a portion of current I2 flows through gain-adjustment transistor M8, the voltage at node 526 is at least partially a function of the source-drain resistance of transistor M8, which is controlled by the gain-control signal at terminal 524. By increasing the source-drain resistance of transistor M8, the voltage at node 526 is increased, thereby decreasing the gate-to-source voltage of transistor M1 and the current that transistor M1 will allow to pass. This reduction in current, when multiplied by the effective resistance of inductive element L1, appears as a reduced voltage at node 552. The gain of VGA-EQ circuit 500 is therefore reduced as a function of the gain-control signal.

Figure 6:
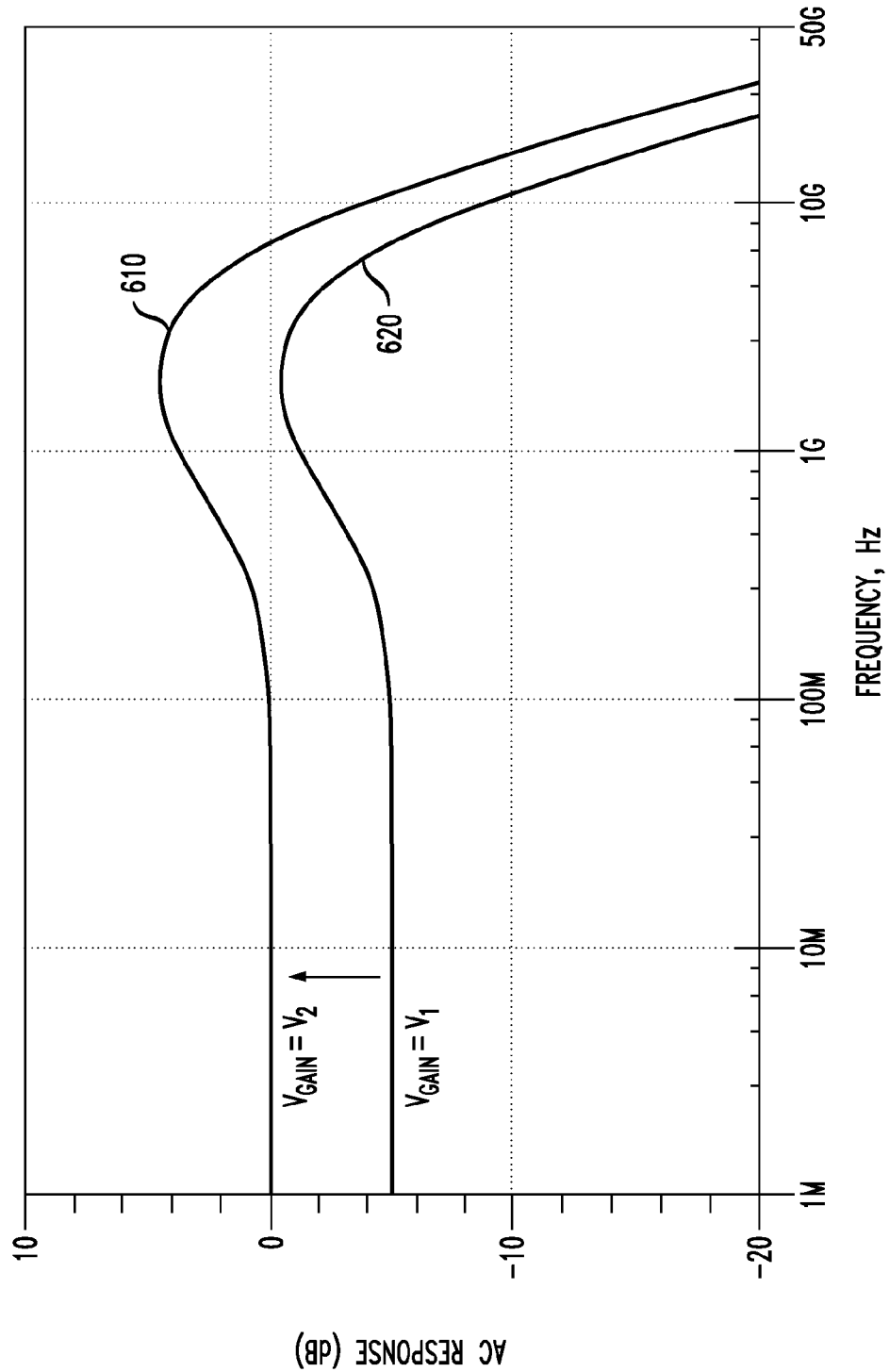
FIG. 6 is a graph illustrating exemplary variation in the frequency response of the combined variable-gain amplifier and analog equalizer circuit of both FIGS. 4 and 5 with gain-control voltage.

FIG. 6 is a graph illustrating the exemplary variation in gain of VGA-EQ circuit 400 with the gain-control setpoint voltage $V_{GAIN}$. Trace 620 represents an exemplary frequency-response curve of VGA-EQ circuit 400 for the case where gain-control setpoint voltage $V_{GAIN}$ has a first magnitude $V_1$. As gain-control setpoint voltage $V_{GAIN}$ is increased to a second, higher magnitude $V_2$, the frequency-response curve shifts up to trace 610, for all relevant frequencies. Conversely, as gain-control setpoint voltage $V_{GAIN}$ is lowered from magnitude $V_1$ to magnitude $V_2$, the frequency-response curve shifts from trace 610 down to trace 620. Because the gain of VGA-EQ circuit 400 is substantially independent of its filter characteristics, the shape of the frequency-response curve is substantially the same for different gain-control setpoint voltages. As such, it may be seen that the gain of VGA-EQ circuit 400 is substantially independent of its filter characteristics. Similarly, the gain of VGA-EQ circuit 500 is also substantially independent of its filter characteristics.

Figure 7:
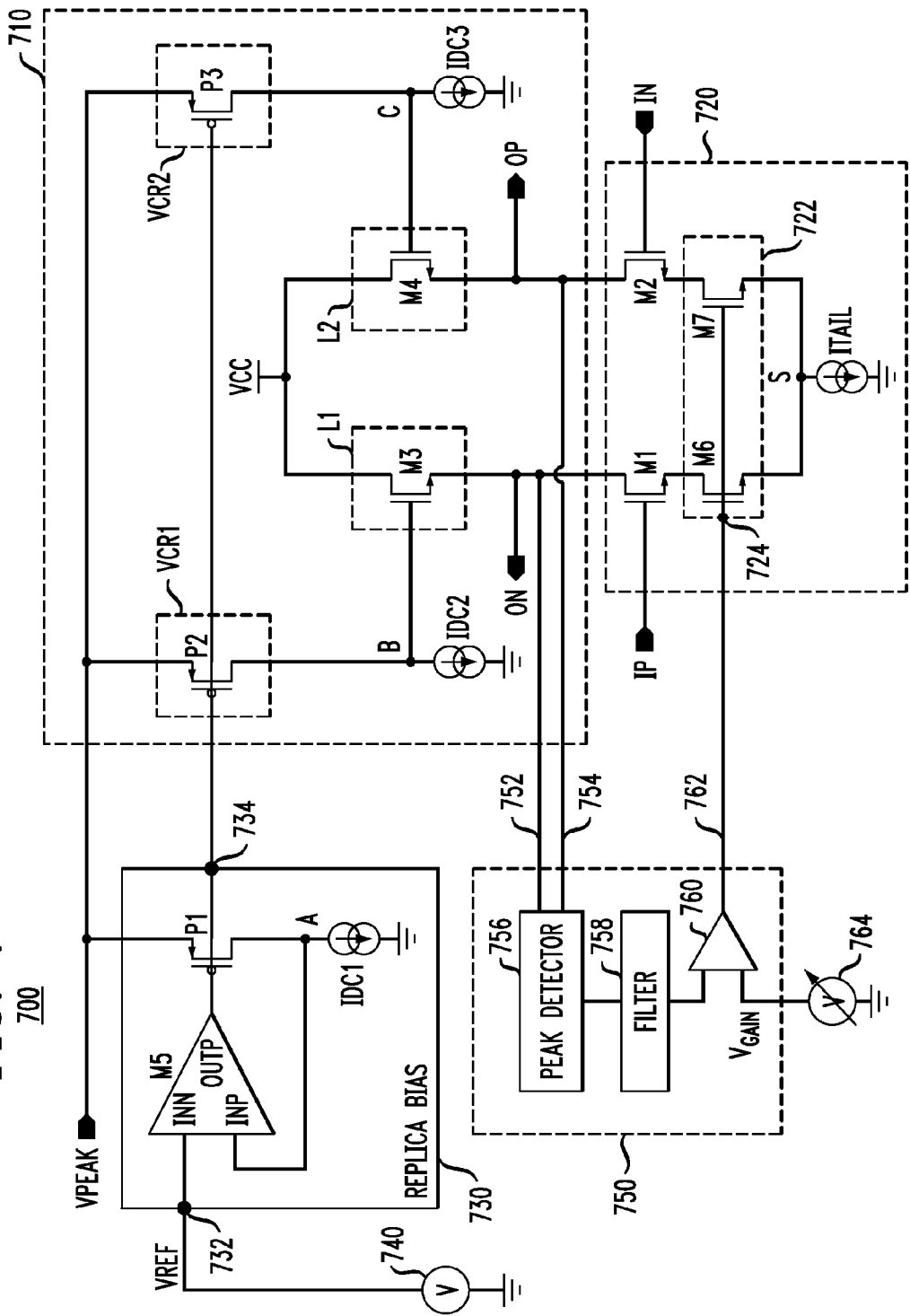
FIGS. 7 and 8 are circuit diagrams of additional combined variable-gain amplifier and analog equalizer circuits.
Figure 8:
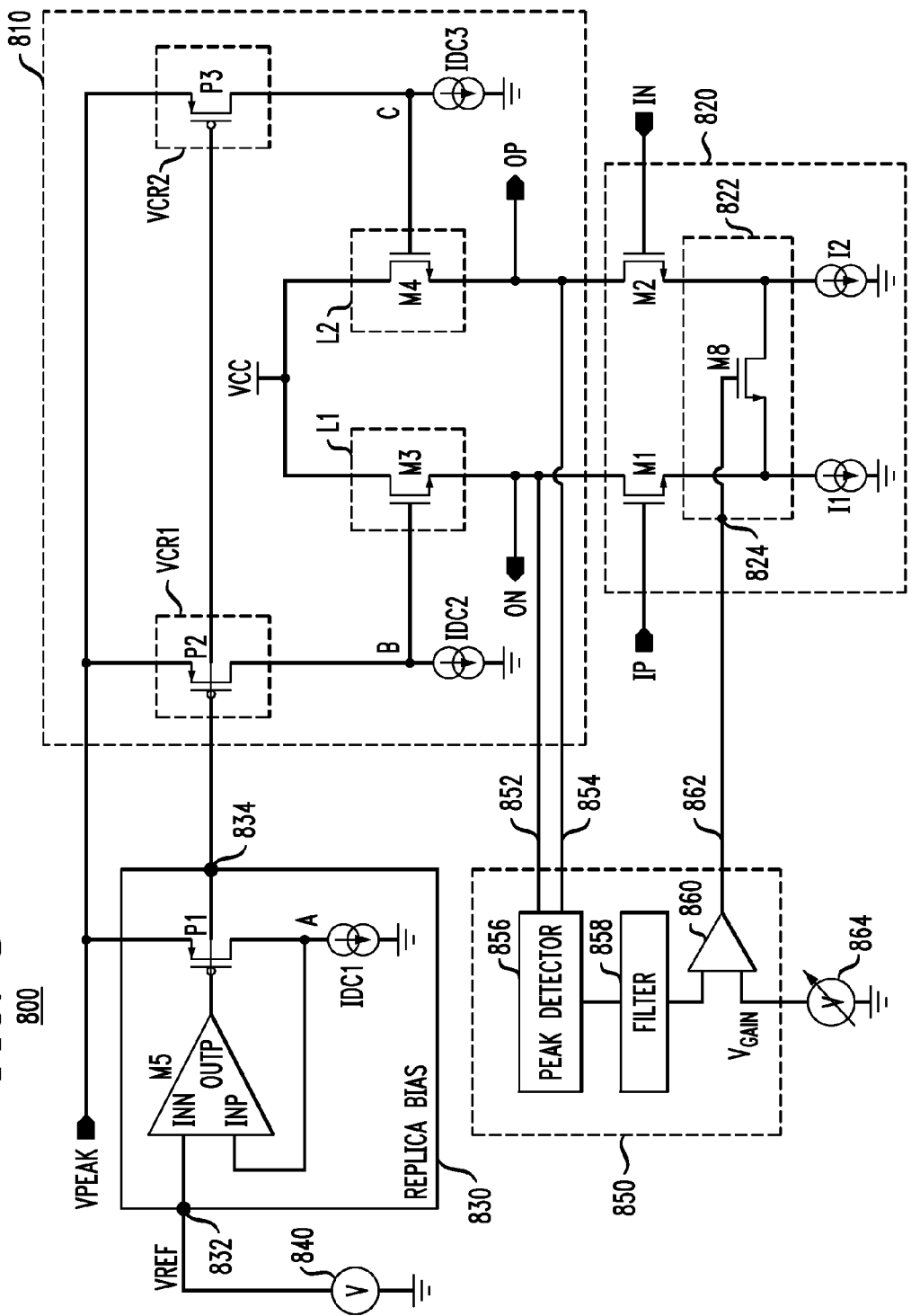

FIGS. 7 and 8 depict highly stable tunable VGA-EQ circuits 700, 800, in which (i) resistors R1 and R2 in FIGS. 4 and 5 have been replaced with active resistances VCR1 and VCR2 and (ii) current sources IDC2 and IDC3, replica bias circuits 730, 830, and voltage sources 740 and 840 have been added. VGA-EQ circuits 700 and 800 are similar to, and operate similarly to, VGA-EQ circuits 400 and 500. Further, active resistances VCR1 and VCR2, current sources IDS2 and IDC3, replica bias circuits 730 and 830 and voltage sources 740, 840 in FIGS. 7 and 8 operate similarly as described above with respect to analog equalizer 300 shown in FIG. 3. (In FIGS. 7 and 8, similar reference numerals identify similar elements as in FIGS. 1-5.)

In particular, by adjusting the reference voltage VREF, the resistances of transistors P1, P2, and P3 may be adjusted over a relatively large range. Consequently, the effective inductance of transistors M3 and M4 and, accordingly, the filter characteristics of amplifiers 720, 820 may be adjusted over a relatively large tuning range. Further, because the gains of VGA-EQ circuits 700, 800 are substantially independent of their filter characteristics, adjusting their filter characteristics has an insubstantial impact on their low-frequency gains.

Because VGA-EQ circuits 400, 500, 700, and 800 provide low-frequency gain control that is substantially independent of the equalization function, they are especially suited for use in high-speed serial-deserializer (SERDES) receivers. VGA-EQ circuits 400, 500, 700, and 800 can also provide significant power savings (e.g., greater than 50% power reduction) over cascaded VGA-EQ solutions.

Although the embodiments of the invention described above employ a differential or double-ended architecture, at least some of the inventive concepts described above may also be implemented in a single-ended architecture. As such, the amplifier 120 may be a single-ended amplifier (e.g., a single transistor), and inductive load circuit 110 may include only one inductive element, rather than the two inductive elements L1 and L2 described above. Similarly, VGA-EQ circuits 400 and 600 may be implemented in a single-ended architecture including inductive element L1, amplifying transistor M1, and gain-adjustment transistor M6, assuming that the source of transistor M6 is connected to ground rather than to current source ITAIL.

The exemplary embodiments of the present invention have been described with respect to processes of circuits, including possible implementation as a single integrated circuit, a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that unless stated otherwise, ground may be considered a power source having a voltage of approximately zero volts, and a power source having any desired voltage may be substituted for ground.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology. Moreover, the transistors may be of opposite type as that described above (e.g., p-type transistors instead of n-type).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims. For example, implementations of source degeneration other than those shown for source-degeneration devices 422 and 522 in FIGS. 4 and 5 may be used.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A receiver for a communication link, the receiver comprising:
   a combined variable-gain amplifier and analog equalizer circuit comprising:
   a current-mode logic (CML) amplifier having an input terminal, an output terminal, and a gain control terminal, the amplifier operable to amplify, with an adjustable gain, a signal received at the input terminal and provide the amplified signal at the output terminal;
   an inductive load circuit coupled to the output terminal of the CML amplifier and having an inductance such that the CML amplifier has a first gain at frequencies below a predetermined frequency value and a second gain at frequencies in a predetermined frequency range above the predetermined frequency value, wherein the second gain is higher than the first gain;
   a gain controller connected to the output and gain-control terminals of the CML amplifier and adapted (i) to receive the amplified signal at the output terminal of the CML amplifier as a feedback and (ii) to provide a gain-control signal to the gain-control terminal of the CML amplifier based on the feedback signal; and
   the CML amplifier is adapted to adjust the first and second gains based on the pain-control signal.

2. The receiver of claim 1, wherein the adjustable gain of the CML amplifier is substantially independent of filter characteristics of the combined variable-gain amplifier and analog equalizer circuit.

3. The receiver of claim 1, wherein the second gain is a frequency-dependent function having a peak within the predetermined frequency range above the predetermined frequency value.

4. The receiver of claim 1, wherein:
   the CML amplifier comprises (i) first and second amplifying transistors, (ii) a gain-adjustment transistor connected between the first and second amplifying transistors, and (iii) first and second current sources, each connected between a different one of the first and second amplifying transistors and ground.

5. The receiver of claim 1, wherein the gain controller includes:
   a peak detector adapted to receive the feedback signal from the CML amplifier; and
   an amplifier having a first input coupled to an output of the peak detector, a second input coupled to a gain-control voltage source, and an output providing the gain-control signal to the gain-control terminal of the CML amplifier.

6. A receiver for a communication link, the receiver comprising:
   a combined variable-gain amplifier and analog equalizer circuit comprising:
   a current-mode logic (CML) amplifier having an input terminal, an output terminal, and a gain control terminal, the amplifier operable to amplify, with an adjustable gain, a signal received at the input terminal and provide the amplified signal at the output terminal; and
   an inductive load circuit coupled to the output terminal of the CML amplifier and having an inductance such that the CML amplifier has a first gain at frequencies below a predetermined frequency value and a second gain at frequencies in a predetermined frequency range above the predetermined frequency value, wherein the second gain is higher than the first gain,
   wherein the CML amplifier comprises (i) first and second amplifying transistors, (ii) first and second gain-adjustment transistors, each connected to a different one of the first and second amplifying transistors, and (iii) a current source connected to the first and second amplifying transistors and to ground.

7. A method of equalizing a signal having inter-symbol interference, the method comprising:
   (a) receiving the signal;
   (b) amplifying the signal via a current-mode logic (CML) amplifier with an inductive load and an adjustable gain, the CML amplifier having a first gain at frequencies below a predetermined frequency and a second gain at frequencies in a predetermined frequency range above the predetermined frequency, wherein the second gain is higher than the first gain;
   (c) outputting the amplified signal;
   (d) providing the amplified signal to a gain controller;
   (e) the gain controller providing a gain-control signal to the CML amplifier based on the amplified signal; and
   (f) the CML amplifier adjusting the first and second gains based on the gain-control signal.

8. The method of claim 7, wherein the second gain is a substantially frequency-dependent function having a peak within the predetermined frequency range above the predetermined frequency.

9. An amplifier circuit (e.g., 400, 500), comprising:
   a first active inductor including a first transistor having a gate, a drain, and a source, wherein the drain of the first transistor is connected to a supply voltage and the gate of the first transistor is adapted to receive an inductance-adjustment signal;
   a second transistor having a gate, a drain, and a source, wherein the drain of the second transistor is connected to the source of the first transistor;
   a third transistor having a gate, a drain, and a source, wherein one of the drain or source of the third transistor is connected to the source of the second transistor and the gate of the third transistor is adapted to receive a gain-control signal, such that the third transistor is adapted to adjust the gain of the amplifier circuit based on the gain-control signal;
   a gain controller connected to the drain of the second transistor and to the gate of the third transistor and adapted (i) to receive a feedback signal from the drain of the second transistor and (ii) to provide the gain-control signal to the gate of the third transistor based on the feedback signal; and
   the third transistor is adapted to adjust the first and second gains based on the gain-control signal.

10. The amplifier circuit of claim 9, wherein the active inductor has an inductance such that the amplifier circuit has a first gain at frequencies below a predetermined frequency and a second gain at frequencies in a predetermined frequency range above the predetermined frequency, wherein the second gain is higher than the first gain;

such that if the amplifier circuit is used as a receive-side analog equalizer, inter-symbol interference in a received signal is reduced.

11. The amplifier circuit of claim 10, wherein the second gain is a substantially frequency-dependent function having a peak within the predetermined frequency range above the predetermined frequency.

12. The amplifier circuit of claim 10, wherein a change in the gain-control signal produces a change in the first and second gains without substantially changing the predetermined frequency.

13. The amplifier circuit of claim 9, further comprising:
a second active inductor including a fourth transistor having a gate, a drain, and a source, wherein the drain of the fourth transistor is connected to a supply voltage and the gate of the fourth transistor is adapted to receive an inductance-adjustment signal; and
a fifth transistor having a gate, a drain, and a source, wherein (i) the drain of the fifth transistor is connected to the source of the fourth transistor and (ii) the source of the fifth transistor is connected to the source of the third transistor.

14. The amplifier circuit of claim 9, further comprising:
a second active inductor including a fourth transistor having a gate, a drain, and a source, wherein the drain of the fourth transistor is connected to a supply voltage and the gate of the fourth transistor is adapted to receive an inductance-adjustment signal; and
a fifth transistor having a gate, a drain, and a source, wherein the drain of the fifth transistor is connected to the source of the fourth transistor and the source of the fifth transistor is connected to another one of the drain and source of the third transistor.

15. A receiver for a communication link, the receiver comprising:
a receive-side analog equalizer comprising:
a current-mode logic (CML) amplifier having an input terminal and an output terminal, the amplifier operable to amplify a signal received at the input terminal and provide the amplified signal at the output terminal, wherein the CML amplifier includes (i) first and second transistors, each having a gate, a drain, and a source, and (ii) a current source, wherein the sources of the first and second transistors are connected together to form a node, and the current source is connected between the node and ground; and
an inductive load circuit coupled to the output terminal of the CML amplifier and having an inductance such that the CML amplifier has a first gain at frequencies below a predetermined frequency value and a second gain at frequencies in a predetermined frequency range above the predetermined frequency value, wherein the second gain is higher than the first gain;
wherein the inductive load circuit includes first and second active inductors connected between a supply voltage and the drains of the first and second transistors, respectively,
the first active inductor comprising:
a third transistor having a gate, a drain, and a source, wherein the drain of the third transistor is connected to a supply voltage and the source of the third transistor is connected to the drain of the first transistor; and
a first active resistor connected between a control voltage and the gate of the third transistor;
the second active inductor comprising:
a fourth transistor having a gate, a drain, and a source, wherein the drain of the fourth transistor is connected to a supply voltage and the source of the fourth transistor is connected to the drain of the second transistor; and
a second active resistor connected between a control voltage and the gate of the fourth transistor;
wherein the first active resistor of the first active inductor comprises:
a fifth transistor having a gate, a drain, and a source, wherein the source of the fifth transistor is connected to the control voltage, and the drain of the fifth transistor is connected to the gate of the third transistor; and
a second current source connected between the drain of the fifth transistor and ground;
wherein the second active resistor of the second active inductor comprises:
a sixth transistor having a gate, a drain, and a source, wherein the source of the sixth transistor is connected to the control voltage and the drain of the sixth transistor is connected to the gate of the fourth transistor; and
a third current source connected between the source of the sixth transistor and ground;
wherein the receive-side analog equalizer reduces inter-symbol interference in a signal received at the receiver.

16. The receiver of claim 15, including a replica bias circuit comprising:
a differential amplifier having a first input terminal, a second input terminal, and an output terminal, the first input terminal being connected to the input terminal of the replica bias circuit, and the output terminal being connected to the output terminal of the replica bias circuit;
a seventh transistor having a gate, a drain, and a source, wherein the source is connected to the control voltage and the drain is connected to the second input terminal of the differential amplifier to form a feedback loop; and
a fourth current source connected between the drain of the seventh transistor and ground;
wherein the seventh transistor forms a current mirror with the fifth and sixth transistors, such that drain-source currents through the fifth and sixth transistors are proportional to a drain-source current through the seventh transistor.

17. The receiver of claim 16, further comprising an adjustable voltage supply connected to the input terminal of the replica bias circuit, such that the reference voltage is adjustable, wherein:
the replica bias circuit produces on its output terminal a bias voltage that is a function of the adjustable reference voltage; and
the drain-source resistance of the fifth and sixth transistors, the effective inductance looking into the sources of the third and fourth transistors, and the frequency response of the CML amplifier are also functions of the adjustable reference voltage.

* * * * *